TRANSISTOR LEVEL SHIFTER

Filed May 2, 1957

*INVENTOR.*
JAMES B. MACKAY

*BY* Alvin J. Riddles

AGENT

United States Patent Office 2,978,595

Patented Apr. 4, 1961

2,978,595

TRANSISTOR LEVEL SHIFTER

James B. Mackay, Highland, N.Y., assignor to International Business Machines Corporation, New York, N.Y., a corporation of New York Filed May 2, 1957, Ser. No. 656,521

3 Claims. (Cl. 307—88.5)

This invention relates to D.C. translating circuits and particular to voltage level translating circuits for transistors.

In circuits wherein there are both small voltage levels and large voltage levels a problem of incompatible characteristics may exist if an attempt is made to use as active elements devices not capable of withstanding one of the voltage levels. This problem is particularly apparent when transistors are used as the active elements. An example of such an incompatible characteristic in connection with transistors is the danger of electrode breakdown or the phenomenon of punch through in a transistor when the device is exposed to large voltages. It is known in the art that the reverse breakdown potential of the electrodes such as the junctions of a transistor may be contlolled by the impurity concentration in the semiconductor material of the transistor at the region immediately adjacent to the electrode and that through control of this impurity concentration electrode junctions may be made that will withstand high voltage. The "punch through" phenomenon may be controlled by varying the thickness of the base region or interelectrode spacing of the transistor. However, frequently, for performance reasons such as frequency response, it is necessary to have a narrow transistor base region or to cause the impurity distribution in the vicinity of a PN junction in a semiconductor device to be such that limitations are placed on the voltages to which such junctions may be subjected in order to prevent breakdown.

This invention is directed to a D.C. translating circuit through which a signal switched through a voltage range which is within the handling capabilities of the active elements used may be translated into a signal switched through a voltage range which is beyond the normal capabilities of such active elements. This is accomplished by providing a circuit made up of two stages the first of which sets one of the desired D.C. output levels and the second of which sets the other output level and is made up of a number of active elements in series arranged so that the total output voltage swing is divided over a number of active elements whereby the tolerable voltage such as in the case of transistors the reverse breakdown and the punch through voltage, of any active elements, is not exceeded.

A primary object of this invention is to provide a D.C. translating circuit.

Another object of this invention is to provide a transistor translating circuit.

Another object of this invention is to provide a method of driving switching circuits requiring a larger signal swing than can be handled by a single active element.

Another object of this invention is to provide a method of driving switching circuits requiring a larger signal swing than can be handled by a single transistor.

Other objects of the invention will be pointed out in the following description and claims and illustrated in the accompanying drawings, which disclose, by way of example, the principle of the invention and the best mode, which has been contemplated, of applying that principle.

Figures 1, 2:
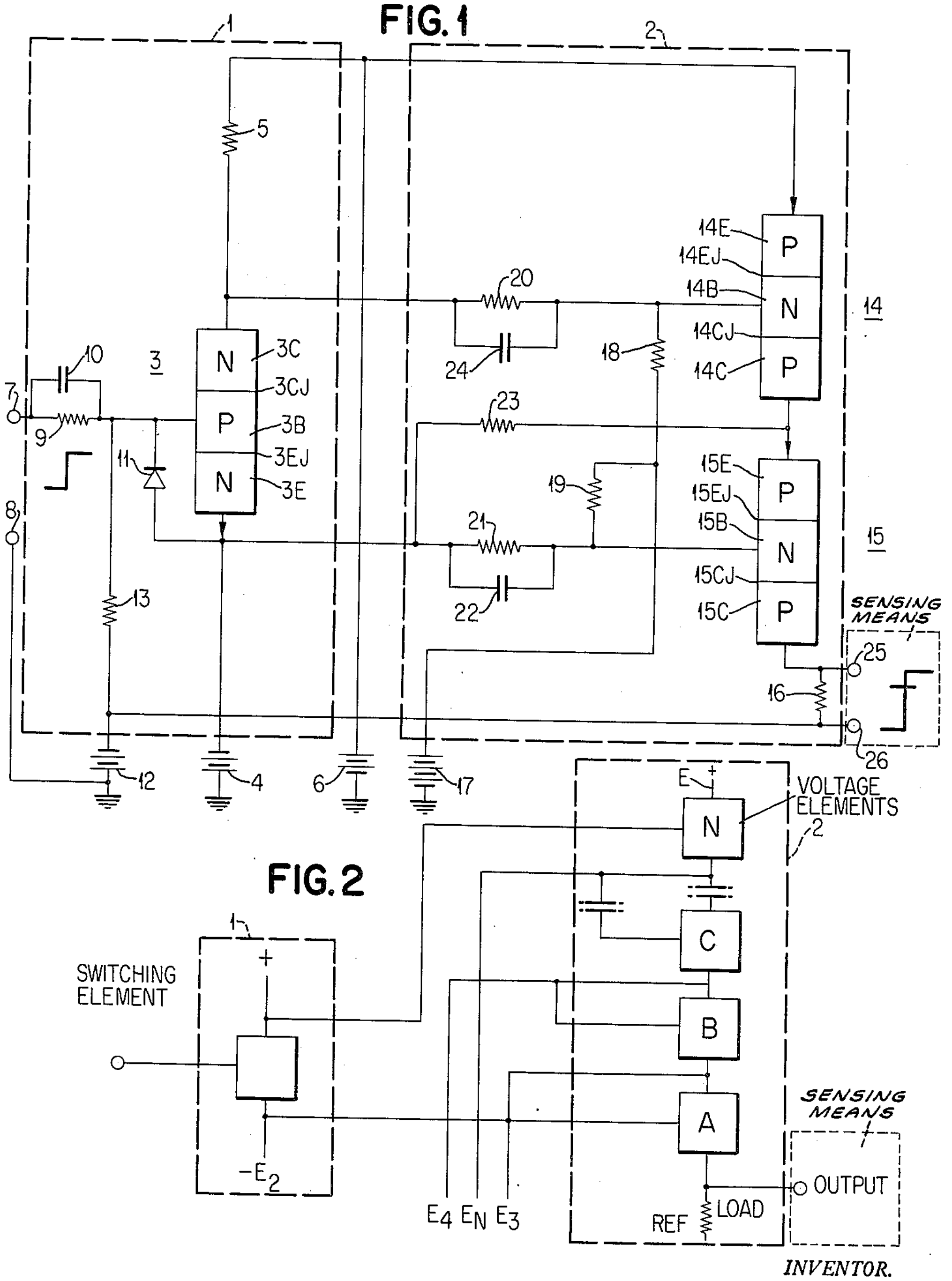
Figure 1 is a transistor circuit illustrating the principle of the invention.
Figure 2 is a block diagram of one manner of extending the principle of this invention to provide a desired voltage translation.

Referring now to Figure 1, the circuit comprises two signal handling stages, a switching and level setting stage 1 and a voltage handling stage 2. The switching and level setting stage includes a switching transistor 3 having an emitter 3E, a base 3B and a collector 3C separated by junctions 3EJ and 3CJ. The emitter 3E is connected to a reference potential shown as battery 4 and the collector 3C is connected through an impedance 5 to a power source shown as battery 6. Input terminals 7 and 8 are provided to impress a potential between the emitter 3E and the base 3B of transistor 3. A current limiting resistor 9 and a pulse shaping capacitor 10 are connected in parallel between the input terminal 7 and the base 3B of transistor 3. Diode 11 is provided between the emitter 3E and the base 3B to limit the potential variation of the base 3B with respect to the emitter 3E and a resistor 13 connected to battery 12 insures that stage 1 is cut off when the input signal level assumes its no signal level and prevents turn on due to ambient temperature changes. The voltage handling stage comprises a first transistor 14 and a second transistor 15 connected in series between two voltage sources shown as batteries 6 and 12. Transistor 14 includes an emitter 14E, a base 14B and a collector 14C separated by junctions 14EJ and 14CJ. Transistor 15 includes an emitter 15E, a base 15B and a collector 15C separated by junctions 15EJ and 15CJ. A load shown as resistance 16 is connected in series with transistors 14 and 15. The bases 14B and 15B of each of transistors 14 and 15 is connected to a source of potential 17 through resistors 18 and 19 respectively. A coupling means is provided connecting the collector 3C of transistor 3 with the base 14B through resistor 20 and capactior 24 in parallel. Base 15B is connected to battery 4 through a current limiting resistor 21 and capacitor 22 in parallel. Collector 14C and emitter 15E are connected to battery 4 through resistor 23.

*Operation*

In the no signal condition the potential level at input terminal 7 with respect to input terminal 8 is at its least positive value. Under these conditions transistor 3 is in the cutoff condition and no current flows from battery 6 through transistor 3 to battery 4. The junction 3EJ is reverse biased by battery 12 acting through resistor 13 and the amount of this reverse bias is limited by the forward voltage drop across diode 11. Both transistors 14 and 15 are connected in series between battery 6 and battery 12 and when transistor 3 is cutoff they are maintained in the cutoff condition by being connected to battery 17 through resistors 18 and 19 respectively, and these resistors also serve temperature compensating functions known in the art. The output potential level under these conditions assumes its most negative value which is that of battery 12 and due to the connection between the emitter 3E and the battery 4 through resistor 23 the potential difference between battery 6 and battery 12 may be substantially equally divided between transistors 14 and 15 so as to minimize the magnitude of the reverse voltage applied to the junctions of each. The values of the various battery potentials must be suitably chosen to achieve this condition.

In the signal condition the potential at input terminal 7 is at its most positive with respect to input terminal 8. This forward biases junction 3EJ and turns on transistor 3 thereby permitting current flow from battery 6 through resistor 5 and transistor 3 to battery 4. As current flows through transistor 3 the potential level at the collector 3C moves toward a more negative state and this negative potential excursion is coupled through current limiting resistor 20 and pulse shaping capacitor 24 to overcome the reverse bias on the emitter junction 14EJ and permit conduction through transistor 14. Collector current from transistor 14 causes sufficient voltage drop across resistor 23 to forward bias the junction 15EJ and permit conduction through transistor 15. Under these conditions current will flow from battery 6 to battery 12 through transistors 14 and 15 in series and an output potential excursion takes place between terminals 25 and 26 of the full value of the difference of potential between batteries 6 and 12 less small voltage drops across transistors 14 and 15 which are now saturated.

What has thus been described is a transistor voltage translating circuit wherein a first signal step is provided comprising a single active element shown as a base input junction transistor having the collector thereof coupled to the base of a first one of a series of active elements shown as junction transistors and one reference potential connection to a point between the junction transistors. The function of the switching stage is to respond to signals of one magnitude in order to initiate conduction in a first one of a plurality of active elements in a series branch provided with potential dividing connections such that a potential appearing across the series branch is impressed in increments on each of the series transistors and each successive active element senses changes in operating conditions of the immediately preceding element. It will then be apparent that as many series active elements as are needed may be provided in the series branch of the circuit encompassed upon the dotted line and labeled element 2, in Figure 1, provided suitable reference and operating voltage levels are provided between successive active elements of the series by adding batteries as required or by using voltage dividing networks.

A schematic diagram of the manner in which this may be accomplished is shown in Figure 2 wherein the switching control stage labeled 1, is effective to provide an input signal for the first active element of the series stage, labeled 2. The series stage has impressed across it a voltage E and having in it, in series, a plurality of active elements A, B, C, . . . N. Potential dividing sources labeled $E_2$, $E_3$, . . . $E_N$ are provided such that the potential E is divided in increments between elements A, B, C, . . . N such that $E>E_2>E_3>E_N$. Individual operating conditions for each of the series active elements between active elements B through N may be supplied by voltage divider networks. Input signals for each active element may be provided by coupling such that output current from each active element of the series stage causes the next active element in the stage to conduct. In order to understand and practice the invention the following set of specifications are provided for the illustrative operative embodiment shown in Figure 1:

| | |
|---|---|
| Transistor 3 | Germanium NPN $\alpha \geqq .97$, $F_{CO}=3$ to 6 megacycles, for example, Sylvania type 2N43A. |
| Transistors 14 and 15 | Germanium PNP $\alpha \geqq .97$, $F_{CO}=5$ megacycles, for example, GE type 2N43. |
| Diode 11 | Germanium junction, for example, Sylvania type 1N34. |
| Resistor 5 | 2,000 ohms. |
| Resistor 18 | 12,000 ohms. |
| Resistor 16 | 1,500 ohms. |
| Resistor 19 | 150,000 ohms. |
| Resistor 23 | 10,000 ohms. |
| Resistor 20 | 12,000 ohms. |
| Resistor 21 | 16,000 ohms. |
| Resistor 13 | 22,000 ohms. |
| Resistor 9 | 4,300 ohms. |
| Capacitor 10 | 100 micromicrofarads. |
| Capacitor 24 | 220 micromicrofarads. |
| Capacitor 22 | 47 micromicrofarads. |
| Battery 12 | 30±1.8 volts. |
| Battery 4 | 10±0.6 volts. |
| Battery 17 | 20±1.2 volts. |
| Battery 6 | 10±0.6 volts. |
| Input signal excursion | −10±2 volts to 0±2 volts. |
| Output signal excursion | −30 (+1.6 volts, −2.3 volts) to +10 (+0.5 volt, −1.2 volts). |

While there have been shown and described and pointed out the fundamental novel features of the invention as applied to a preferred embodiment, it will be understood that various omissions and substitutions and changes in the form and details of the device illustrated in its operation may be made by those skilled in the art without departing from the spirit of the invention. For example, transistor conductivity types may be readily interchanged by one skilled in the art so long as the signal developed by the first stage is compatible with the signal required by the series stage. It is the intention, therefore, to be limited only as indicated by the scope of the following claims:

What is claimed is:

1. A voltage level translating circuit comprising in comprising in combination a first transistor having emitter, base and collector electrodes operatively associated therewith, a power source having a first voltage, a reference potential, means connecting said first transistor between said power source and said reference potential to provide current flow therethrough, means associated with said base and operative to prevent current flow through said transistor, a load impedance, means connecting one terminal thereof to reference potential, a second transistor having emitter, base and collector electrodes operatively associated therewith, means connecting the collector of said second transistor to the remaining terminal of said load impedance, a third transistor having emitter, base and collector electrodes operatively associated therewith, means connecting the collector of said third transistor to the emitter of said second transistor, means connecting the emitter of said third transistor to said power source, means applying a second voltage less than said first voltage of said power source to the base of said second transistor, means applying a third voltage less than said second voltage to the base of said third transistor, coupling means applying potential excursions at the collector of said third transistor to the base of said second transistor, coupling means applying signals as a result of current flow through said first transistor to said base of said third transistor, means for impressing input signals of a first predetermined magnitude on the base of said first transistor operative to overcome said means preventing current flow through said first transistor and sensing means associated with the serial combination of said second and said third transistors operative to sense signals of a second predetermined magnitude greater than said first magnitude.

2. The translating circuit of claim 1 wherein said first transistor is an NPN type transistor and said second and said third transistors are PNP type transistors.

3. A voltage level translating circuit comprising in combination an input and a voltage handling stage, said input stage comprising a first transistor having emitter, base and collector electrodes, a power source having a first voltage, a reference potential, means connecting said first transistor between said power source and said reference potential to provide current flow therethrough, means associated with said base and operative to prevent current flow through said transistor, a load impedance, means connecting one terminal thereof to reference potential, said voltage handling stage comprising at least two serially connected transistors each having emitter, base and collector electrodes, means connecting the collector of the last transistor to the remaining terminal of said load impedance, means connecting the collector of each transistor in the series to the emitter of the following transistor, means connecting the emitter of the first transistor to said power source, means applying an increasing fraction of a voltage of a first predetermined magnitude to the base of each serially connected transistor, coupling means applying potential excursions at the collector of each said serially connected transistor to the base of the immediately following serially connected transistor, coupling means applying signals as a result of current flow through said first transistor to said base of the first serially connected transistor, means for impressing input signals of a second predetermined magnitude less than said first predetermined magnitude on the base of said first transistor operative to overcome said means preventing current flow through said first transistor and sensing means associated with the serial combination of said second and said third transistors operative to sense signals of a second predetermined magnitude greater than said first magnitude.

References Cited in the file of this patent

UNITED STATES PATENTS

| | | |
|---|---|---|
| 1,986,597 | Nyman | Jan. 1, 1935 |
| 2,474,435 | Moore | June 28, 1949 |
| 2,681,993 | Shockley | June 22, 1954 |
| 2,772,410 | Logue | Nov. 27, 1956 |
| 2,835,829 | Sourgens | May 20, 1958 |
| 2,838,664 | Wolfendale | June 10, 1958 |
| 2,860,261 | Verkruissen | Nov. 11, 1958 |

OTHER REFERENCES

IRE Transactions on Circuit Theory, vol. CT–3, No. 1, March 1956, pages 44–51, "An N-Shape Series Transistor Circuit," by K. H. Beck.

UNITED STATES PATENT OFFICE

CERTIFICATE OF CORRECTION

Patent No. 2,978,595 April 4, 1961

James B. Mackay

It is hereby certified that error appears in the above numbered patent requiring correction and that the said Letters Patent should read as corrected below.

Column 4, line 29, strike out "comprising in".

Signed and sealed this 12th day of September 1961.

(SEAL)
Attest:

ERNEST W. SWIDER
Attesting Officer

DAVID L. LADD
Commissioner of Patents

USCOMM-DC